United States Patent [19]
Kondoh et al.

[11] Patent Number: 6,027,796
[45] Date of Patent: Feb. 22, 2000

[54] MESOPOROUS CERAMIC FILM WITH ONE DIMENSIONAL THROUGH CHANNELS AND PROCESS FOR ITS PRODUCTION

[75] Inventors: Shinji Kondoh; Shin-ichi Hirano; Koichi Kikuta, all of Aichi, Japan

[73] Assignees: Japan as represented by Director General of Agency of Industrial Science and Technology; Fine Ceramics Research Association, both of Tokyo, Japan

[21] Appl. No.: 08/993,015

[22] Filed: Dec. 18, 1997

[30] Foreign Application Priority Data

Dec. 20, 1996 [JP] Japan .................................. 8-354930

[51] Int. Cl.$^7$ .................................. B32B 3/26; B05D 3/02
[52] U.S. Cl. .................................. 428/312.8; 428/315.7; 428/304.4; 428/319.1; 428/701; 427/126.2; 427/226; 427/271
[58] Field of Search .................................. 428/304.4, 315.5, 428/318.4, 319.1, 312.8, 325, 329, 701, 702, 432, 315.7; 106/601, 602, 605; 210/50.21, 500.25; 427/126.2, 126.3, 226, 271

[56] References Cited

U.S. PATENT DOCUMENTS

| | | | |
|---|---|---|---|
| 4,584,280 | 4/1986 | Nanao et al. | 501/80 |
| 4,654,228 | 3/1987 | Komiyama | 427/180 |
| 4,980,338 | 12/1990 | Yamazaki | 505/1 |
| 5,407,887 | 4/1995 | Miyashita et al. | 502/258 |
| 5,415,891 | 5/1995 | Liu et al. | 427/243 |
| 5,762,737 | 6/1998 | Bloink et al. | 156/89 |
| 5,858,462 | 1/1999 | Tamazaki et al. | 427/226 |
| 5,858,523 | 1/1999 | Kawai et al. | 428/312.6 |

FOREIGN PATENT DOCUMENTS

| | | |
|---|---|---|
| 6-37291 | 5/1994 | Japan . |
| 7-8729 | 1/1995 | Japan . |

OTHER PUBLICATIONS

Kazuki Nakanishi, et al., "Macropore Structure Design of Sol-Gel Derived Silica By Spinodal Decomposition," Ceramic Transactions, Porous Materials, The American Ceramics Society, (1992), pp. 51–60.

Hideki Masuda, et al., "Fabrication of Textured Porous Polymer Membrane From Anodic Porous Alumina," Japan Ceramics Society, preprints from Spring 1995 Conference, pp. 485, 3F4 01.

Primary Examiner—Deborah Jones
Assistant Examiner—Stephen Stein
Attorney, Agent, or Firm—Oblon, Spivak, McClelland, Maier & Neustadt, P.C.

[57] ABSTRACT

The present invention provides a ceramic film with a variety of structures having one-dimensional through channels which can be utilized favorably in the separation of molecules or microparticles or as a support film for a catalyst with a large surface area or for a catalyst of high activity, and also provides a method for manufacturing this film efficiently and with good reproducibility, and the present invention relates to a ceramic film having one-dimensional through channels, which is a porous ceramic film having nanometer-size pores that go through one-dimensionally from one surface of the film to the other surface, characterized in that the porous ceramic film is formed on a substrate of glass, ceramic, or a heat-resistant metal; and relates to a method for manufacturing the above-mentioned ceramic film.

6 Claims, 6 Drawing Sheets

MESOPOROUS CERAMIC FILM WITH ONE DIMENSIONAL THROUGH CHANNELS AND PROCESS FOR ITS PRODUCTION

BACKGROUND OF THE INVENTION

1. Field of the Invention

The present invention relates to a ceramic film having one-dimensional through channels (hereinafter sometimes referred to as a one-dimensional through channel ceramic film), and to a method for manufacturing this film. More particularly, the present invention relates to a ceramic film with a variety of compositions and with one-dimensional through channels, which can be utilized favorably as a separation membrane for molecules and fine particles or as a carrier membrane for a catalyst with high activity or for a catalyst with a large specific surface area, and to a method for manufacturing this film efficiently and with good reproducibility. The one-dimensional through channel ceramic film of the present invention is useful as a means for separating a variety of molecules and fine particles or in chemical reaction control because it exhibits a nanometer-size separation function, a catalyst function, and a catalyst carrier function.

2. Description of the Art

Development is underway for ceramic porous materials and ceramic filters that have excellent heat and corrosion resistance when used to separate molecules or fine particles contained in high-temperature gases and corrosive liquids, or as carriers for high-activity catalysts or for catalysts that can be used at high temperatures of about 1000° C. A method in which a ceramic raw material powder is sintered, and the open pores (through channels that open onto the surface of the ceramic material) formed in the course of the densification of the ceramic material are utilized in their as-formed state (Japanese Laid-Open Patent Application 7-8729) is often employed as a method for producing a porous ceramic or a porous ceramic membrane.

Nevertheless, a ceramic or ceramic membrane produced in this manner tends not to have pores of uniform size, and it was difficult to produce pores on the nanometer order with good reproducibility. Another problem was that pores closed up within the ceramic matrix (hereinafter sometimes referred to as closed pores), which did not contribute to the separation function or catalyst function, accounted for a considerable percentage of the total.

A porous silica has been produced by a process combining a sol-gel method with spinodal decomposition in an effort to produce with good reproducibility a porous material that has uniform pore size on the nanometer order and that contains almost no closed pores (Nakanishi et al., "Ceramic Transactions, Porous Materials," The American Ceramics Society, 51–60 (1992) ), but in this case the silica phase is formed with a reticulated texture, and the shape of the pores is irregular and the direction thereof random.

If the shape of the pores was thus irregular and the direction thereof random, then when the product was used as a ceramic filter, for example, there was a problem in that a pressure loss occurred because of the large quantity of the ceramic portion that scattered the molecules or particles moving in the permeation direction and hindered their movement.

In an effort to solve the above problems, there have been attempts at developing a ceramic film having a nanometer-size pore diameter and also having pores that go through one-dimensionally (hereinafter sometimes referred to as one-dimensional through channels). A typical example of this is a porous alumina film produced by the anodic oxidation of aluminum (Japanese Patent Publication 6-37291). A film produced by the anodic oxidation of aluminum offers the advantage of considerable heat and corrosion resistance because the pore diameter can be controlled within a range of from several nanometers to several tens of nanometers by varying the conditions under which the film is produced, and because the film is made up of alumina. However, a drawback was that in the case of a porous alumina film produced by anodic oxidation, because of the fundamental limitations imposed by the use of anodic oxidation of an aluminum foil or an aluminum sheet of some thickness in an electrolytic solution, the obtained film was limited to amorphous alumina that was only stable near room temperature, and an aluminum sheet was the only choice for the substrate.

A method in which a porous alumina film manufactured by anodic oxidation is used as a casting mold to transfer a pore pattern to a polymer membrane has been tried as a method for compensating for the above drawbacks to a porous alumina film produced by anodic oxidation (Masuda et al.; Japan Ceramics Society, preprints from Spring 1995 Conference, p. 485, 3F4 01).

In this case, however, the material to which the structure of the porous alumina film produced by anodic oxidation is transferred is limited to an organic material, and another drawback is the difficulty of applying a membrane to which the film structure has been transferred over another substrate to produce a new ceramic film composite.

SUMMARY OF THE INVENTION

The present invention provides a ceramic film with a variety of structures having one-dimensional through channels which can be utilized favorably in the separation of molecules or microparticles or as a support film for a catalyst with a large surface area or for a catalyst of high activity, and also provides a method for manufacturing this film efficiently and with good reproducibility.

The present invention relates to a ceramic film having one-dimensional through channels, which is a porous ceramic film having nanometer-size pores that go through one-dimensionally from one surface of the film to the other surface, characterized in that the porous ceramic film is formed on a substrate of glass, ceramic, or a heat-resistant metal; and relates to a method for manufacturing the above-mentioned ceramic film by forming an amorphous film on a substrate, heat treating this under conditions that will bring about a eutectic decomposition reaction, forming by means of this eutectic decomposition reaction a ceramic film composite composed of a ceramic phase grown one-dimensionally on a substrate and a surrounding matrix phase, and then removing by etching the ceramic phase grown one-dimensionally in the ceramic film composite.

DETAILED DESCRIPTION OF THE INVENTION

An object of the present invention is to solve the above drawbacks encountered with prior art, and to provide, with a commonly used ceramic material, a porous ceramic film having nanometer-size one-dimensional through channels that can be utilized in gas separation membranes and catalysts. Another object is to provide a novel ceramic film composite comprising various one-dimensional through channel ceramic films formed on a porous or dense substrate composed of glass, a ceramic, or a heat-resistant metal.

Another object is to provide a method for manufacturing this one-dimensional through channel ceramic film efficiently and with good reproducibility.

The present invention was conceived in an effect to solve the above problems, and the one-dimensional through channel ceramic film of the present invention has nanometer-size pores that go through one-dimensionally from one surface of the film to the other surface, obtained by the removal of the one-dimensionally grown ceramic phase from a ceramic film composite composed of a one-dimensionally grown ceramic phase formed by eutectic reaction and a surrounding ceramic matrix phase, wherein this one-dimensional through channel ceramic film is characterized by being formed on a substrate of glass, ceramic,.or a heat-resistant metal.

The one-dimensional through channel ceramic film pertaining to the present invention has preferred embodiments in which the substance that makes up the above-mentioned one-dimensional through channel ceramic film is a metal oxide; the substrate that supports the above-mentioned ceramic film is a porous material; and the average diameter of the above-mentioned one-dimensional through channels is 1 to 50 nanometers.

The method of the present invention for manufacturing a one-dimensional through channel ceramic film is characterized in that a ceramic film composite composed of countless ceramic phases grown one-dimensionally by eutectic reaction perpendicular to the substrate surface, and a ceramic matrix that surrounds these, is formed, and the ceramic phases grown one-dimensionally in the ceramic film composite are then removed by etching.

The present invention will now be described in further detail.

Specifically, the one-dimensional through channel ceramic film of the present invention is produced by a three-stage process. In the first stage, a vapor phase growth method, such as sputtering, or a solution method, such as a sol-gel method, is used to produce an amorphous film composed of at least a ternary system including a transition metal, another metal, and oxygen.

Here, the valence of the transition metal contained in the film is suitably controlled so as to make possible the targeted eutectic reaction. For example, when a eutectic reaction is to be brought about by oxidative decomposition of an Fe—Si—O system, and when a film is to be produced by sputtering, a mixture of FeO and $SiO_2$ is used for the target to set the valence of the Fe to a ferric state or to a ferric and ferrous mixed state. FIG. 1 shows an example of a film produced in this manner. It can be seen that a dense film is formed on a glass substrate. This film was confirmed by X-ray analysis to be amorphous.

In the second stage, the sample produced in the first stage is heat treated in a high-temperature oxidative atmosphere to separate and precipitate oxides of the transition metal and the other metal. It is important that the two-phase co-precipitation from this amorphous phase occur simultaneously and from the film surface. For instance, when a sputtered film of an Fe—Si—O system is treated at a temperature of about 600° C. in air, a film structure as shown in FIG. 2 is formed. In this figure, it can be seen that one-dimensionally elongated hematite ($Fe_2O_3$) (the black linear portion in the figure) and silica ($SiO_2$) surrounding thereabout form a eutectic microstructure.

The hematite crystals elongate perpendicular to the film surface from the film surface toward the interface with the substrate, and this is interpreted to be a result of the oxidation reaction of the Fe proceeding from the film surface, and a eutectic decomposition reaction proceeding from the film surface toward the substrate interface. FIG. 3 shows a schematic of how the Fe—Si—O—system amorphous film is split into phases by an oxidative eutectic decomposition reaction. Divalent Fe is present in the amorphous film, but this changes to trivalent when it encounters the oxygen diffused out of the surface of the film. Hematite nuclei are formed at this point, but the silica component that cannot enter the hematite structure is exsolved and becomes concentrated around the hematite. This forms a regular periodic microstructure of hematite and silica at the reaction interface. As oxygen moves from the film surface into the interior, the periodic two-dimensional microstructure grows toward the film interior, and as a result, needle-like crystals of hematite elongate perpendicular to the film surface.

In the third stage, out of the eutectic microstructure formed in this manner, only the one-dimensionally elongated phases are selectively etched and removed by the use of an acid or an alkali. Actually, in the case of an Fe—Si—O system, one-dimensionally elongated hematite is soluble in an aqueous solution of hydrochloric acid, whereas silica is insoluble in this solution, so it is possible to selectively etch the film by immersing it in a hydrochloric acid aqueous solution. FIG. 4 shows an example in which the hematite has been eliminated by a hydrochloric acid treatment for a sputtered Fe—Si—O film that has been heat treated. The one-dimensionally elongated, white contrasting portion in FIG. 4 consists of holes from which the hematite has been removed, and the diameter thereof is about 5 nanometers.

The diameter of these holes more or less corresponds to the diameter of the ceramic phases grown one-dimensionally in the heat treatment of the second stage. The diameter of the ceramic phases grown one-dimensionally in the second stage varies with the ratio of the metal component contained in the amorphous phase manufactured in the first stage. For instance, in the case of an Fe—Si—O film, if a sample in which the ratio of Si to Fe is 30% is produced by sputtering and heat treated at 600° C. hematite with a diameter of approximately 8 nanometers will be deposited, but if the same treatment is conducted with a sample in which the ratio of Si to Fe is 40%, hematite with a diameter of approximately 5 nanometers will be deposited. Since through channels of roughly the same diameter are obtained when these samples are treated with a hydrochloric acid solution to remove the hematite, it is possible to control the through channel diameter by this method.

FIG. 5 is a schematic of the procedure for forming the one-dimensional through channel ceramic film of the present invention on a porous ceramic substrate.

In the figure, (a) is a cross section of the porous ceramic substrate, (b) illustrates the situation when the holes in the surface of the ceramic substrate have been filled in with a resin that is soluble in a certain type of solvent, and the surface has then been polished smooth, (c) illustrates the situation when an amorphous ceramic film has been formed over the substrate surface obtained in (b), (d) illustrates the situation when the resin packed into the substrate surface has been removed with a solvent, (e) illustrates the situation when the sample produced in (d) has been heat treated in an oxidative atmosphere, and the amorphous film has been changed into a film of a mixed phase comprising a transition metal oxide grown one-dimensionally and a surrounding ceramic matrix phase, and (f) illustrates the situation when the transition metal oxide phase grown one-dimensionally has been removed by an etching treatment to produce a one-dimensional through channel film.

Methods for producing the amorphous film in the first stage include sputtering, vapor deposition, CVD, laser abrasion, molecular beam epitaxy, and other such physical film formation methods. In addition to these, a sol-gel method, a spray pyrolysis method, wet coating, or another such solution deposition method, plating, or any other method can be utilized here as long as it allows a dense film to be produced. Of these, sputtering is the preferred method because an amorphous film can be obtained with ease, and because this method lends itself well to mass production and the formation of a film with a large surface area.

When an amorphous film is formed by sputtering or the like, the method for mixing the two types of metal compound to create a target can be chosen freely, but it is extremely advantageous to use as a target the product of simply mixing a transition metal compound powder with another metal compound powder. For example, when a film composed of an amorphous phase of an Fe—Si—O system is to be produced, the product of simply mixing an FeO powder with an $SiO_2$ powder can be used as the target.

One combination of the elements contained in the amorphous film is a transition metal, another metal element, and oxygen. The transition metal should be one that will separate from the other metal contained in the film after the heat treatment to form separate compound phases, but when ease of handling during sputtering or during heat treatment is taken into account, one or more 3d transition metals such as vanadium, chromium, manganese, nickel, iron, cobalt, copper, or zinc, or alloys having these as their principal components, are preferable. Other polyvalent cations of cerium, neodymium, samarium, erbium, and other rare earth elements can also be used. The metal element other than a transition metal should be one that will not react with the transition metal during the heat treatment in the second stage. This metal element becomes the matrix phase that surrounds the needle-like crystals of the transition metal compound during the heat treatment, and becomes the component that makes up the film having one-dimensional through channels after etching, and therefore is chosen as dictated by the intended use of the film. For example, when the film is to be used as a photocatalyst, titanium is used as the metal element, iron as the transition metal element, and oxygen as the cation to perform the treatment of the above-mentioned third stage. As a result, a porous film of $TiO_2$ is obtained.

The treatment conditions for the heating of the amorphous film containing a transition metal, another metal, and a cation should be such that a eutectic decomposition reaction will occur. Specifically, to take temperature as an example, the temperature should be one at which a eutectic decomposition reaction will occur, and at which the reaction will proceed at a sufficient velocity. In the case of an oxide, in specific terms, a temperature of around 500° C. can often be used to advantage. The valence of the transition metal must be varied in order to bring about a eutectic decomposition reaction. There are two methods for accomplishing this: treating the amorphous film in an oxidative atmosphere, and treating it in a reductive atmosphere. In the case of a eutectic reaction of an oxide, treatment in a reductive atmosphere may result in inhomogeneous nucleation, and a homogeneous eutectic microstructure may not be formed. In this case, a homogeneous eutectic microstructure can be formed by performing the heat treatment in an oxidative atmosphere.

The substrate used in the manufacture of a ceramic film having one-dimensional through channels as discussed above can be chosen from among glass, ceramics, and heat-resistant metals, and a porous substrate, rather than a dense one, can also be used. Stainless steel, Hastelloy, or another such oxidation-resistant alloy composed of iron, nickel, chromium, vanadium, and the like are favorable as the heat-resistant metal used for the substrate. FIG. 5 illustrates an example of a method for forming a film using a porous ceramic substrate. Specifically, the surface of a ceramic or porous metal with an average pore diameter from several nanometers to several tens of nanometers is impregnated with a resin or metal, the surface is polished in this state, and a smooth surface is formed. Next, this surface is washed with water and a surfactant, and this product is used as a substrate over which an amorphous film is formed. The impregnating resin or metal is removed before moving on to the subsequent heating treatment, and one that can be removed under the same etching conditions as the transition metal oxide produced after heating can be used favorably.

In the third stage, of the eutectic microstructure formed in this manner, only the one-dimensionally elongated phases are selectively etched and removed using an acid or alkali. The acid used in this etching treatment is chosen from among those suited to the selective removal of only the one-dimensionally elongated phases, such as sulfuric acid, hydrochloric acid, nitric acid, oxalic acid, and acetic acid. In specific terms, in the case of an Fe—Si—O system, one-dimensionally elongated hematite is soluble in an aqueous solution of hydrochloric acid, whereas silica is insoluble in this solution, so a hydrochloric acid aqueous solution is used as the etching solution.

As discussed above, the method of the present invention for manufacturing a porous ceramic film having one-dimensional through channels is characterized in that an amorphous film formed on a substrate is heat treated under conditions that bring about a eutectic decomposition reaction, a ceramic film composite composed of a ceramic phase grown one-dimensionally on a substrate and a surrounding matrix phase is formed as a result of this eutectic decomposition reaction, and the ceramic phase grown one-dimensionally in the ceramic film composite is removed by etching; this allows for the provision of various one-dimensional through channel ceramic films having novel structures and compositions. The one-dimensional through channel ceramic film of the present invention makes it possible to obtain ceramic films with various compositions, and in this respect is fundamentally different from conventional anodic oxidation alumina films and the like.

With the present invention, the first step is to form an amorphous film composed of a transition metal element, another metal element, and oxygen that bonds these two metals together, and then subject the film obtained by an oxidation or reduction treatment to a eutectic decomposition reaction, which produces a ceramic film composite composed of one-dimensionally grown ceramic phases and a surrounding ceramic matrix phase. Finally, the one-dimensionally grown ceramic phases are removed to leave behind only the ceramic matrix phase portion, which yields a one-dimensional through channel ceramic film having nanometer-size pores that go through one-dimensionally from one surface of the film to the other surface. A major characteristic is that the diameter of the through channels finally obtained can be varied by means of the mixing ratio of the transition metal and the other metal in the amorphous film that is produced first, and by the reaction conditions during the eutectic decomposition (specifically, the heat treatment temperature and atmosphere).

Any method with which it is possible to produce a dense, amorphous film can be used as the means for forming the first amorphous film, such as sputtering, vapor deposition, CVD, laser abrasion, molecular beam epitaxy, or another such physical film formation method; a sol-gel method, a spray pyrolysis method, wet coating, or another such solution deposition method; or plating. Therefore, a substrate of glass, a ceramic, or a heat-resistant metal can be utilized when sputtering or another such physical film formation method is used in particular.

(a) a cross section of the porous ceramic substrate (b) the situation when the ceramic substrate has been impregnated with a resin, after which the surface has been polished until the ceramic substrate surface appears (c) the state when an amorphous film has been formed over the polished surface obtained in (b)

(d) the state after the film along with the substrate has been immersed in a solvent to remove the impregnating resin applied in (b)

(e) the state when a eutectic microstructure has been formed in the film interior by a heat treatment (f) the situation when the one-dimensionally elongated phases have been removed from the film interior by etching using an acid or the like to complete a ceramic film composite.

Figure 6:
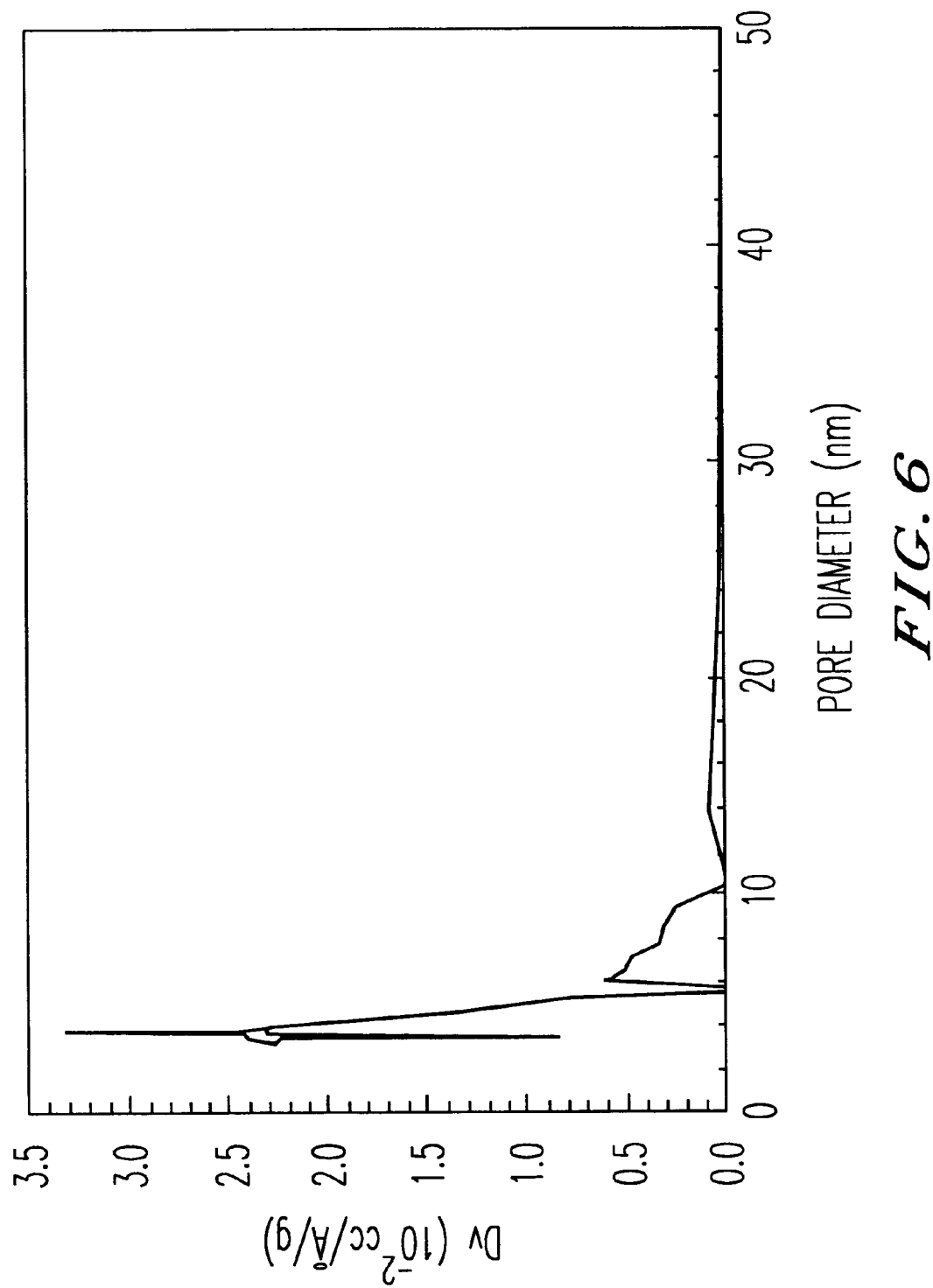

FIG. 6 shows the relationship between pore diameter and adsorption volume of $N_2$ gas of the mesoporous silica film measured by the isothermal adsorption-desorption in liquid nitrogen.

DESCRIPTION OF THE PREFERRED EMBODIMENTS

The present invention will now be described in specific terms through embodiments.

PRACTICAL EXAMPLE 1

A three-component amorphous film of Fe—Si—O, in which the atomic ratio of iron and silicon was 7:3, was formed by sputtering on a silica glass substrate with a thickness of 1.2 mm. A target 3 inches in diameter, comprising a mixture of an FeO reagent powder with an average particle diameter of 2 $\mu$m and an $SiO_2$ reagent powder with average particle diameter of 1 $\mu$m, was used in the sputtering. A vacuum chamber was evacuated down to $5 \times 10^{-6}$ Torr, after which argon gas was introduced, the argon gas flux was adjusted such that the gas pressure in the interior of the vacuum chamber would be $2 \times 10^{-2}$ Torr, and 200 W of high-frequency energy was inputted to generate a plasma. The film deposition rate here was about 0.37 nm/sec, and no substrate heating or bias voltage application was performed during the film deposition.

Figure 1:
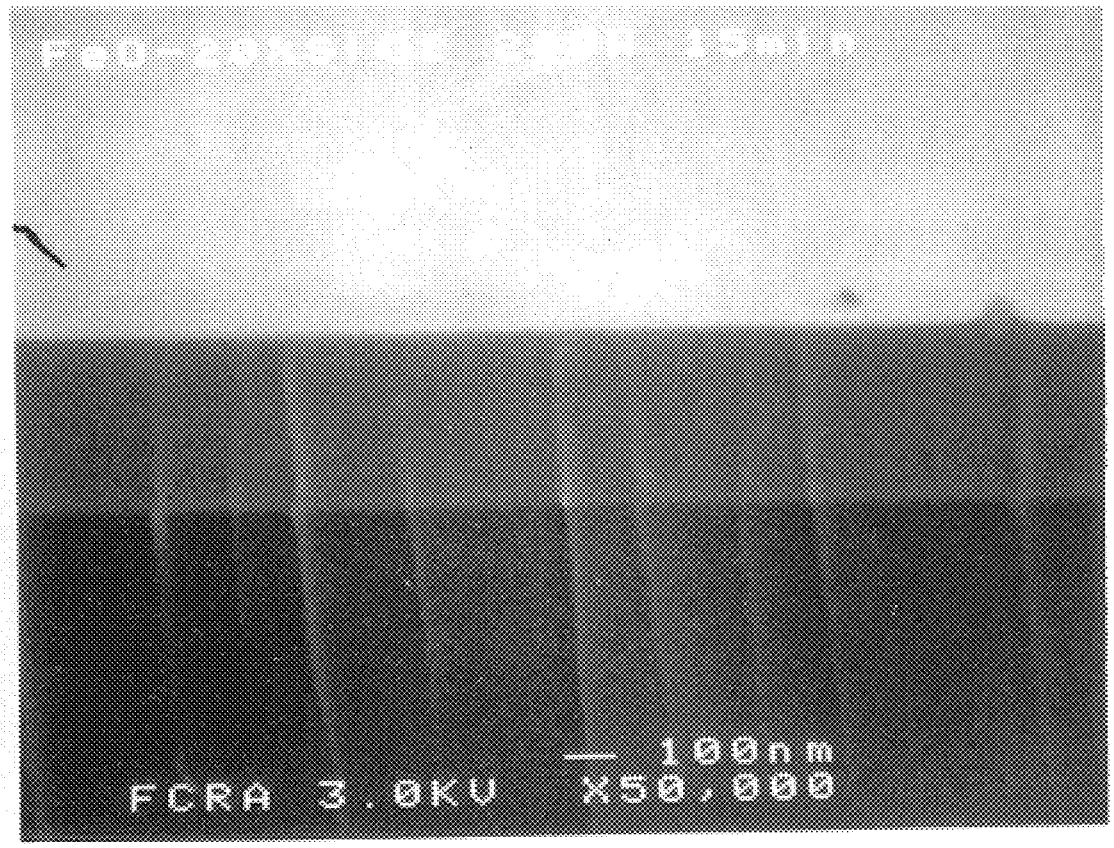
FIG. 1 is a diagram (SEM photograph) of the cross sectional structure of an Fe—Si—O amorphous film produced on a glass substrate.

The microstructure in cross section of the amorphous film thus formed was observed by scanning electron microscope (SEM), the results of which are shown in FIG. 1. It can be seen that an amorphous film with a thickness of approximately 330 nm was formed on the glass substrate. No cracks, pores, or other such defects were noted in the amorphous film, and it can be seen that an extremely dense film was formed.

Figure 2:
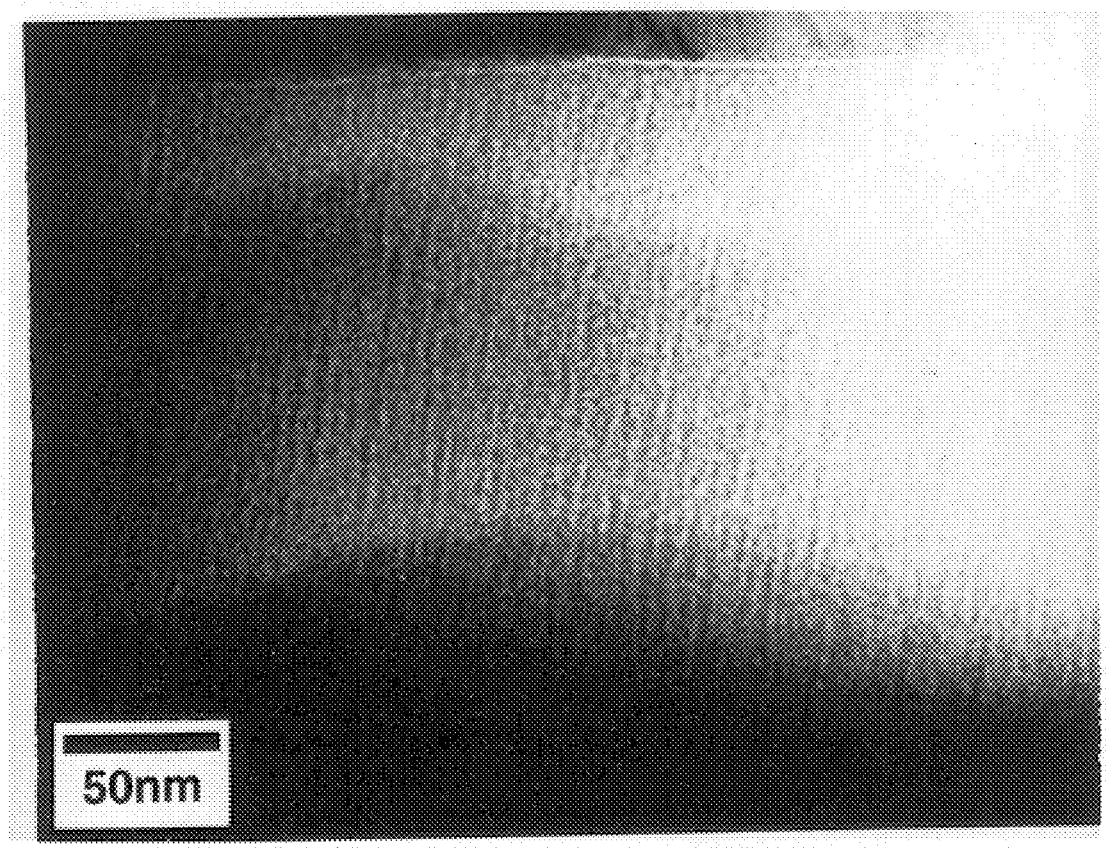
FIG. 2 is a diagram (TEM photograph) of the cross sectional structure of a sample produced by heat treating an Fe—Si—O amorphous film in the air for 2 hours at 600° C., and shows needle-like hematite crystals (the black linear portion in the figure) precipitated in an amorphous silica matrix (the white linear portion in the figure)
Figure 3:
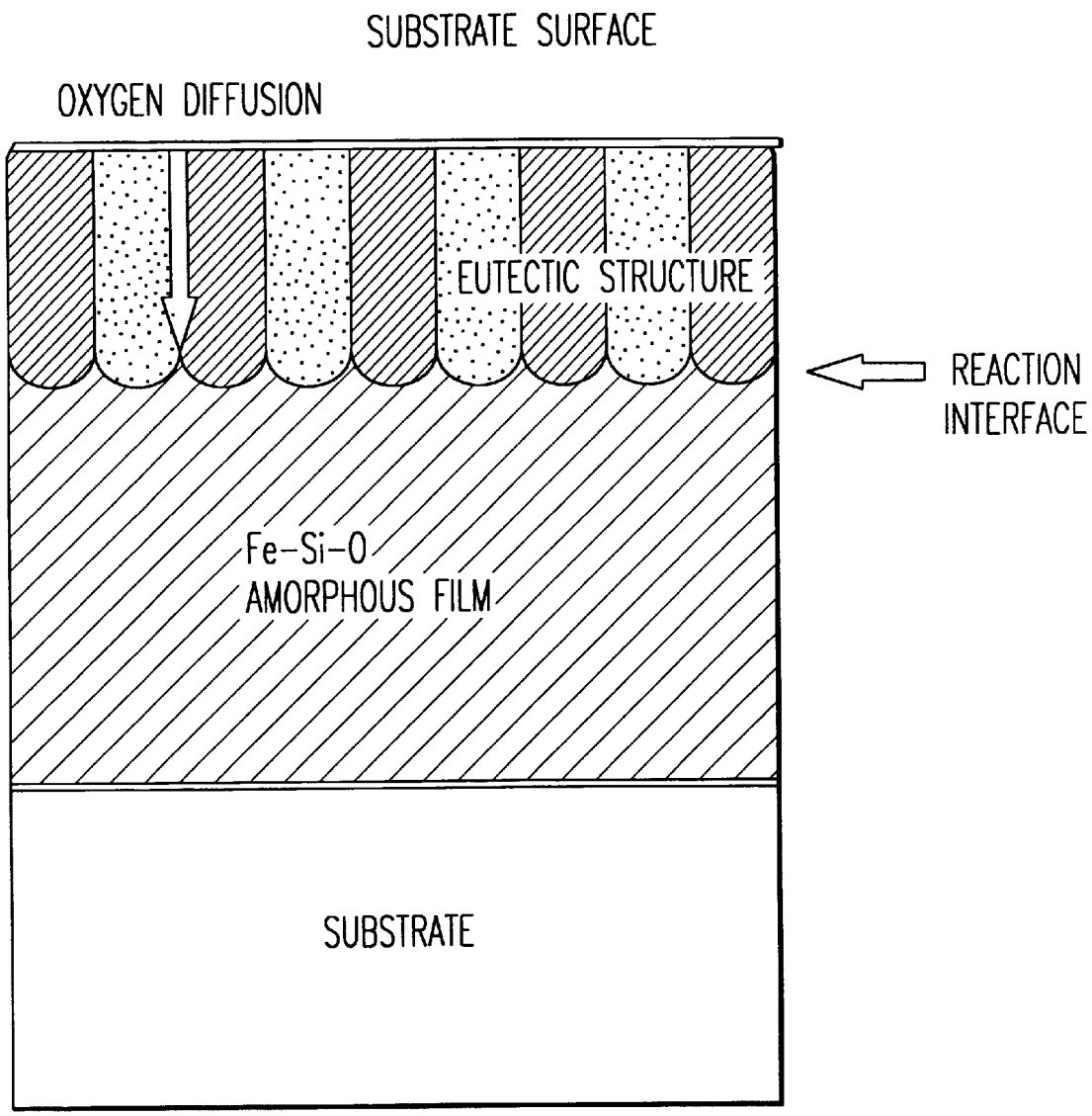
FIG. 3 is a diagram of the process by which the eutectic microstructure shown in FIG. 2 is formed.
Figure 4:
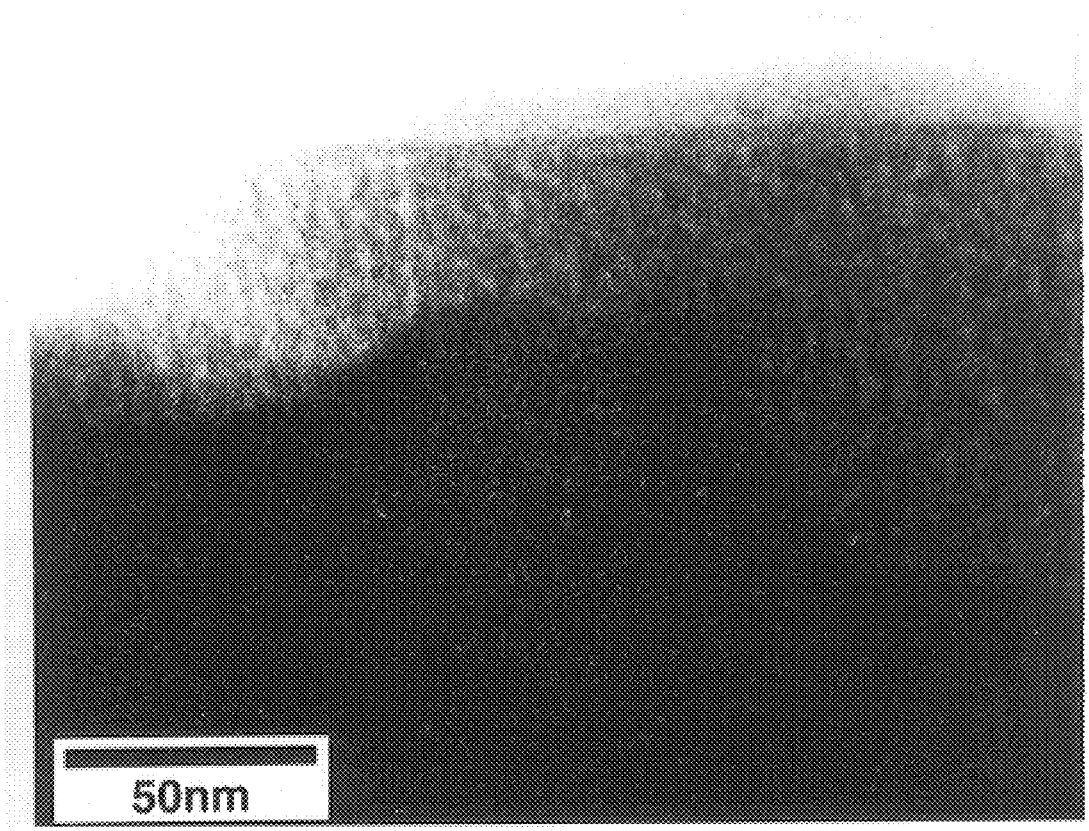
FIG. 4 is a diagram (TEM photograph) of the cross sectional structure of the same sample as that shown in FIG. 2 when it has undergone an etching treatment with a hydrochloric acid aqueous solution to remove the hematite, and shows the amorphous silica matrix (the black linear portion in the figure) and the one-dimensionally elongated through channels (the white linear portion in the figure)
Figure 5A:
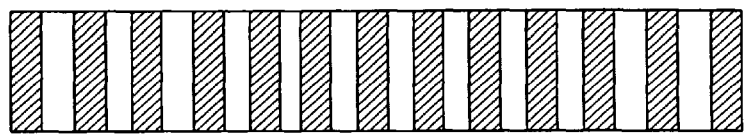
FIG. 5 is a diagram of the basic procedure for forming the porous ceramic film pertaining to the present invention.
Figure 5B:
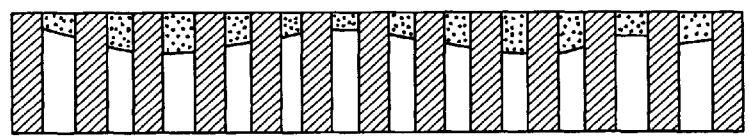
Figure 5C:
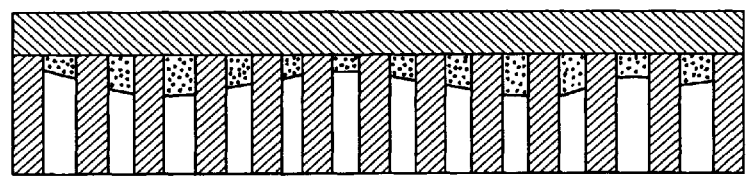
Figure 5D:
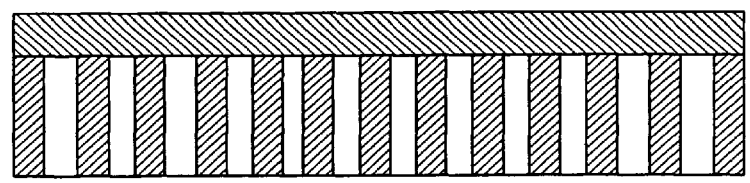
Figure 5E:
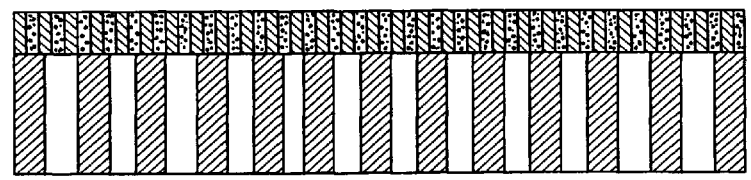
Figure 5F:
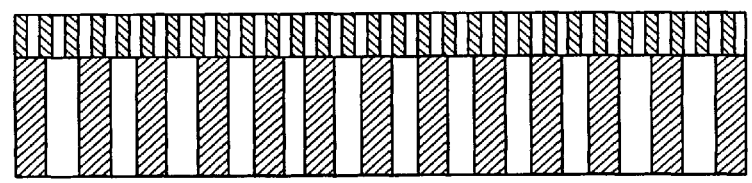

Next, the amorphous film produced by the above method was treated for 2 hours at 600° C. in air. FIG. 2 shows the results of observing the heat treated film under a transmission electron microscope (TEM). It can be seen from this figure that one-dimensionally elongated needle-like hematite (the black linear portion in the figure) and silica (the white linear portion in the figure) surrounding thereabout formed a eutectic microstructure. The hematite crystals extended from the film surface toward the interface with the substrate, perpendicular to the film surface, and the diameter thereof was about 8 nm.

Finally, the film heat treated by the above method was immersed in an aqueous solution of hydrochloric acid and water (1:1) along with the substrate, and only the hematite was removed. The microstructure of the film cross section was observed by TEM, which revealed that through channels with roughly the same diameter as that of the hematite prior to acid treatment were present in the remaining silica film. FIG. 6 shows the relationship between pore diameter and adsorption volume of $N_2$ gas of the mesoporous silica film measured by the isothermal adsorption-desorption in liquid nitrogen. There exists a sharp desorption peak at a pore diameter of about 4 nm as designed. This pore diameter coincides well with the value measured by TEM observations. The specific surface area of the film was measured to be as high as 1000 $m^2/g$.

PRACTICAL EXAMPLE 2

A three-component amorphous film of Fe—Si—O, in which the atomic ratio of iron and silicon was 6:4, was formed by sputtering on a silica glass substrate with a thickness of 1.2 mm. A target 3 inches in diameter, comprising a mixture of an FeO reagent powder with an average particle diameter of 2 $\mu$m and an $SiO_2$ reagent powder with average particle diameter of 1 $\mu$m, was used in the sputtering. A vacuum chamber was evacuated down to $5 \times 10^{-6}$ Torr, after which argon gas was introduced, the argon gas flux was adjusted such that the gas pressure in the interior of the vacuum chamber would be $2 \times 10^{-2}$ Torr, and 200 W of high-frequency energy was inputted to generate a plasma. The film deposition rate here was about 0.28 nm/sec, and no substrate heating or bias voltage application was performed during the film deposition.

The microstructure in cross section of the amorphous film thus formed was observed by scanning electron microscope (SEM), which revealed that an amorphous film with a thickness of approximately 250 nm had been formed on the glass substrate in roughly the same manner as in Embodiment 1. No cracks, pores, or other such defects were noted in the amorphous film, and it was found that an extremely dense film had been formed.

Next, the amorphous film produced by the above method was treated for 2 hours at 600° C. in air. The heat treated film was observed under a transmission electron microscope (TEM), which revealed that one-dimensionally elongated needle-like hematite and silica surrounding thereabout formed a eutectic microstructure in the same manner as in Embodiment 1. The hematite crystals extended from the film surface toward the interface with the substrate, perpendicular to the film surface, and the diameter thereof was about 5 nm.

Finally, the film heat treated by the above method was immersed in an aqueous solution of hydrochloric acid and water (1:1) along with the substrate, and only the hematite was removed. The microstructure of the film cross section was observed by TEM, which revealed that through channels with roughly the same diameter as that of the hematite prior to acid treatment were present in the remaining silica film.

PRACTICAL EXAMPLE 3

A three-component amorphous film of Fe—Si—O, in which the atomic ratio of iron and silicon was 6:4, was formed by sputtering on a silica glass substrate with a thickness of 1.2 mm. A target 3 inches in diameter, comprising a mixture of an FeO reagent powder with an average particle diameter of 2 $\mu$m and an $SiO_2$ reagent powder with average particle diameter of 1 $\mu$m, was used in the sputtering. A vacuum chamber was evacuated down to $5\times10^{-6}$ Torr, after which argon gas was introduced, the argon gas flux was adjusted such that the gas pressure in the interior of the vacuum chamber would be $2\times10^{-2}$ Torr, and 200 W of high-frequency energy was inputted to generate a plasma. The film deposition rate here was about 0.28 nm/sec, and no substrate heating or bias voltage application was performed during the film deposition.

The microstructure in cross section of the amorphous film thus formed was observed by scanning electron microscope (SEM), which revealed that an amorphous film with a thickness of approximately 250 nm had been formed on the glass substrate in roughly the same manner as in Embodiment 1. No cracks, pores, or other such defects were noted in the amorphous film, and it was found that an extremely dense film had been formed.

Next, the amorphous film produced by the above method was treated for 10 hours at 400° C. in air. The heat treated film was observed under a transmission electron microscope (TEM), which revealed that one-dimensionally elongated needle-like hematite and silica surrounding thereabout formed a eutectic microstructure in the same manner as in Embodiment 1. The hematite crystals extended from the film surface toward the interface with the substrate, perpendicular to the film surface, and the diameter thereof was about 2 nm.

Finally, the film heat treated by the above method was immersed in an aqueous solution of hydrochloric acid and water (1:1) along with the substrate, and only the hematite was removed. The microstructure of the film cross section was observed by TEM, which revealed that through channels with roughly the same diameter as that of the hematite prior to acid treatment were present in the remaining silica film.

PRACTICAL EXAMPLE 4

A three-component amorphous film of Fe—Si—O, in which the atomic ratio of iron and silicon was 6:4, was formed by sputtering on a silica glass substrate with a thickness of 1.2 mm. A target 3 inches in diameter, comprising a mixture of an FeO reagent powder with an average particle diameter of 2 $\mu$m and an $SiO_2$ reagent powder with average particle diameter of 1 $\mu$m, was used in the sputtering. A vacuum chamber was evacuated down to $5\times10^{-8}$ Torr, after which argon gas was introduced, the argon gas flux was adjusted such that the gas pressure in the interior of the vacuum chamber would be $2\times10^{-2}$ Torr, and 200 W of high-frequency energy was inputted to generate a plasma. The film deposition rate here was about 0.28 nm/sec, and no substrate heating or bias voltage application was performed during the film deposition.

The microstructure in cross section of the amorphous film thus formed was observed by scanning electron microscope (SEM), which revealed that an amorphous film with a thickness of approximately 250 nm had been formed on the glass substrate in roughly the same manner as in Embodiment 1. No cracks, pores, or other such defects were noted in the amorphous film, and it was found that an extremely dense film had been formed.

Next, the amorphous film produced by the above method was treated for 1 hour at 800° C. in air. The heat treated film was observed under a transmission electron microscope (TEM), which revealed that the hematite crystals were not needle-like, but rather had been deposited in a spherical form with a diameter of approximately 10 nm that was included in a silica matrix.

Finally, the film heat treated by the above method was immersed in an aqueous solution of hydrochloric acid and water (1:1) along with the substrate, but not all of the hematite crystals could not removed even after 100 hours.

PRACTICAL EXAMPLE 5

A three-component amorphous film of Fe—Si—O, in which the atomic ratio of iron and silicon was 6:4, was formed by sputtering on a silica glass substrate with a thickness of 1.2 mm. A target 3 inches in diameter, comprising a mixture of an FeO reagent powder with an average particle diameter of 2 $\mu$m and an $SiO_2$ reagent powder with average particle diameter of 1 $\mu$m, was used in the sputtering. A vacuum chamber was evacuated down to $5\times10^{-6}$ Torr, after which argon gas was introduced, the argon gas flux was adjusted such that the gas pressure in the interior of the vacuum chamber would be $2\times10^{-2}$ Torr, and 200 W of high-frequency energy was inputted to generate a plasma. The film deposition rate here was about 0.28 nm/sec, and no substrate heating or bias voltage application was performed during the film deposition.

The microstructure in cross section of the amorphous film thus formed was observed by scanning electron microscope (SEM), which revealed that an amorphous film with a thickness of approximately 250 nm was formed on the glass substrate in roughly the same manner as in Embodiment 1. No cracks, pores, or other such defects were noted in the amorphous film, and it was found that an extremely dense film had been formed.

Next, the amorphous film produced by the above method was treated for 2 hours at 600° C. in argon gas containing 3% hydrogen. The heat treated film was observed under a transmission electron microscope (TEM), which revealed that the hematite crystals had segregated around cracks believed to have occurred during heating, with the area around the cracks observed to be decorated for several microns, and an even eutectic microstructure could not be obtained.

PRACTICAL EXAMPLE 6

Then, a three-component amorphous film of Fe—Si—O, in which the atomic ratio of iron and silicon was 6:4, was formed by sputtering on a zirconia substrate with a thickness of 1 mm. A target 3 inches in diameter, comprising a mixture of an FeO reagent powder with an average particle diameter of 2 μm and an $SiO_2$ reagent powder with average particle diameter of 1 μm, was used in the sputtering. A vacuum chamber was evacuated down to $5 \times 10^{-6}$ Torr, after which argon gas was introduced, the argon gas flux was adjusted such that the gas pressure in the interior of the vacuum chamber would be $2 \times 10^{-2}$ Torr, and 200 W of high-frequency energy was inputted to generate a plasma. The film deposition rate here was about 0.39 nm/sec, and no substrate heating or bias voltage application was performed during the film deposition.

The microstructure in cross section of the amorphous film thus formed was observed by scanning electron microscope (SEM), which revealed that an amorphous film with a thickness of approximately 350 nm had been formed on the substrate in roughly the same manner as in Embodiment 1. No cracks, pores, or other such defects were noted in the amorphous film, and it was found that an extremely dense film had been formed.

Next, the amorphous film produced by the above method was treated for 2 hours at 600° C. in air. The heat treated film was observed under a transmission electron microscope (TEM), which revealed that one-dimensionally elongated needle-like hematite and silica surrounding thereabout formed a eutectic microstructure in the same manner as in Embodiment 1. The needle-like hematite crystals in the upper eutectic layer extended from the film surface toward the interface with the substrate, perpendicular to the film surface, and the diameter thereof was about 12 nm.

Finally, the film heat treated by the above method was immersed in an aqueous solution of hydrochloric acid and water (1:1) along with the substrate, and only the hematite was removed. The microstructure of the film cross section was observed by TEM, which revealed that through channels with roughly the same diameter as that of the hematite prior to acid treatment were present in the remaining silica film.

PRACTICAL EXAMPLE 7

A three-component amorphous film of Fe—Si—O, in which the atomic ratio of iron and silicon was 6:4, was formed by sputtering on a hastelloys substrate with a thickness of 2 mm. A target 3 inches in diameter, comprising a mixture of an FeO reagent powder with an average particle diameter of 2 μm and an $SiO_2$ reagent powder with average particle diameter of 1 μm, was used in the sputtering. A vacuum chamber was evacuated down to $5 \times 10^{-6}$ Torr, after which argon gas was introduced, the argon gas flux was adjusted such that the gas pressure in the interior of the vacuum chamber would be $2 \times 10^{-2}$ Torr, and 200 W of high-frequency energy was inputted to generate a plasma. The film deposition rate here was about 0.56 nm/sec, and no substrate heating or bias voltage application was performed during the film deposition.

The microstructure in cross section of the amorphous film thus formed was observed by scanning electron microscope (SEM), which revealed that an amorphous film with a thickness of approximately 500 nm had been formed on the substrate in roughly the same manner as in Embodiment 1. No cracks, pores, or other such defects were noted in the amorphous film, and it was found that an extremely dense film had been formed.

Next, the amorphous film produced by the above method was treated for 2 hours at 600° C. in air. The heated film had cracks in it here and there that were thought to be attributable to the difference in the coefficient of thermal expansion from that of the substrate. The heat treated film was observed under a transmission electron microscope (TEM), which revealed that one-dimensionally elongated needle-like hematite and silica surrounding thereabout formed a eutectic microstructure in the same manner as in Embodiment 1. The hematite crystals extended from the film surface toward the interface with the substrate, perpendicular to the film surface, and the diameter thereof was about 30 nm.

Finally, the film heat treated by the above method was immersed in an aqueous solution of hydrochloric acid and water (1:1) along with the substrate, and only the hematite was removed. The microstructure of the film cross section was observed by TEM, which revealed that through channels with roughly the same diameter as that of the hematite prior to acid treatment were present in the remaining silica film.

PRACTICAL EXAMPLE 8

A method involving the use of a porous ceramic substrate by the same procedure as the method shown in FIG. 5 was examined. Specifically, the pore portion of a commercially available anodic oxidized alumina filter membrane with an average particle diameter of 0.2 μm was impregnated with an ethanol-soluble resin (Lakesite Cement), after which the surface was polished with a diamond abrasive having an average particle diameter of 2 μm until a smooth surface was obtained. This surface was then washed with water and a surfactant, and this product was used as a substrate, over which an amorphous film was formed by sputtering.

A target 3 inches in diameter, comprising a mixture of an FeO reagent powder with an average particle diameter of 2 μm and an $SiO_2$ reagent powder with average particle diameter of 1 μm, was used in the sputtering. A vacuum chamber was evacuated down to $5 \times 10^{-6}$ Torr, after which argon gas was introduced, the argon gas flux was adjusted such that the gas pressure in the interior of the vacuum chamber would be $2 \times 10^{-2}$ Torr, and 200 W of high-frequency energy was inputted to generate a plasma. The film deposition rate here was about 0.24 nm/sec, and no substrate heating or bias voltage application was performed during the film deposition.

The microstructure in cross section of the amorphous film thus formed was observed by scanning electron microscope (SEM), which revealed that an amorphous film with a thickness of approximately 220 nm had been formed on the glass substrate in roughly the same manner as in Embodiment 1. No cracks, pores, or other such defects were noted in the amorphous film, and it was found that an extremely dense film had been formed.

The film thus obtained was immersed along with the substrate for 48 hours in ethanol, and the Lakesite Cement contained in the substrate pores was dissolved and removed. Almost no peeling of the amorphous film formed by sputtering occurred when the resin was dissolved in ethanol at room temperature, but the problem of partial peeling of the amorphous film did occur when the ethanol temperature was raised to 80° C. in order to raise the dissolution rate of the resin.

Next, the amorphous film produced by the above method was treated for 2 hours at 600° C. in air. The heat treated film was observed under a transmission electron microscope (TEM), which revealed that one-dimensionally elongated needle-like hematite and silica surrounding thereabout formed a eutectic microstructure in the same manner as in Embodiment 1. The hematite crystals extended from the film surface toward the interface with the substrate, nearly perpendicular to the film surface, but because of the hematite grown from the pore portion of the substrate on the back side, a portion was also seen where needles inclined at about 10 degrees extended from the normal line of the film surface.

Finally, the film heat treated by the above method was immersed in an aqueous solution of hydrochloric acid and water (1:1) along with the substrate, and only the hematite was removed. The microstructure of the film cross section was observed by TEM, which revealed that through channels with roughly the same diameter as that of the hematite prior to acid treatment were present in the remaining silica film.

PRACTICAL EXAMPLE 9

A three-component amorphous film of Fe—Si—O, in which the atomic ratio of iron and silicon was 7:3, was formed by sputtering on a silica glass substrate with a thickness of 1.2 mm. A target 3 inches in diameter, comprising a mixture of an FeO reagent powder with an average particle diameter of 2 $\mu$m and an $SiO_2$ reagent powder with average particle diameter of 1 $\mu$m, was used in the sputtering. A vacuum chamber was evacuated down to $5 \times 10^{-6}$ Torr, after which argon gas was introduced, the argon gas flux was adjusted such that the gas pressure in the interior of the vacuum chamber would be $2 \times 10^{-2}$ Torr, and 200 W of high-frequency energy was inputted to generate a plasma. The film deposition rate here was about 0.33 nm/sec, and no substrate heating or bias voltage application was performed during the film deposition.

The microstructure in cross section of the amorphous film thus formed was observed by scanning electron microscope (SEM), which revealed that an amorphous film with a thickness of approximately 300 nm had been formed on the glass substrate in roughly the same manner as in Embodiment 1. No cracks, pores, or other such defects were noted in the amorphous film, and it was found that an extremely dense film had been formed.

Next, the amorphous film produced by the above method was put in to a quartz glass vessel filled with magnetite ($Fe_3O_4$) having an average particle diameter of 3 $\mu$m, after which the vessel was vacuum evacuated. This vessel was put into an electric furnace and treated for 2 hours at 600° C. in air. The heat treated film was observed under a transmission electron microscope (TEM), which revealed that one-dimensionally elongated needle-like hematite and silica surrounding thereabout formed a eutectic microstructure in the same manner as in Embodiment 1. The hematite crystals extended from the film surface toward the interface with the substrate, perpendicular to the film surface, and the diameter thereof was about 50 nm.

Finally, the film heat treated by the above method was immersed in an aqueous solution of hydrochloric acid and water (1:1) along with the substrate, and only the hematite was removed. The microstructure of the film cross section was observed by TEM, which revealed that through channels with roughly the same diameter as that of the hematite prior to acid treatment were present in the remaining silica film.

PRACTICAL EXAMPLE 10

Then, a three-component amorphous film of Fe—Si—O, in which the atomic ratio of iron and silicon was 6:4, was formed by sputtering on a silica glass substrate coated with the two-component amorphous film of Fe—O. A target 3 inches in diameter, comprising a mixture of an FeO reagent powder with an average particle diameter of 2 $\mu$m and an $SiO_2$ reagent powder with average particle diameter of 1 $\mu$m, was used in the sputtering. A vacuum chamber was evacuated down to $5 \times 10^{-6}$ Torr, after which argon gas was introduced, the argon gas flux was adjusted such that the gas pressure in the interior of the vacuum chamber would be $2 \times 10^{-2}$ Torr, and 200 W of high-frequency energy was inputted to generate a plasma. The film deposition rate here was about 0.39 nm/sec, and no substrate heating or bias voltage application was performed during the film deposition.

The microstructure in cross section of the amorphous film thus formed was observed by scanning electron microscope (SEM), which revealed that an amorphous film with a thickness of approximately 350 nm had been formed on the Fe—O amorphous layer with thickness of about 10 nm on silica glass substrate in roughly the same manner as in Embodiment 1. No cracks, pores, or other such defects were noted in the amorphous film, and it was found that an extremely dense film had been formed.

Next, the amorphous film produced by the above method was treated for 2 hours at 600° C. in air. The heat treated film was observed under a transmission electron microscope (TEM), which revealed that one-dimensionally elongated needle-like hematite and silica surrounding thereabout formed a eutectic microstructure in the same manner as in Embodiment 1 on hematite layer with thickness of about 11 nm. The needle-like hematite crystals in the upper eutectic layer extended from the film surface toward the interface with the substrate, perpendicular to the film surface, and the diameter thereof was about 12 nm.

Finally, the film heat treated by the above method was immersed in an aqueous solution of hydrochloric acid and water (1:1) along with the substrate, and only the hematite was removed. However, in this case, the mesoporous silica film was peeled off and picked up from the aqueous solution.

As discussed above, the present invention relates to a ceramic film having one-dimensional through channels, which is a porous ceramic film having nanometer-size pores that go through one-dimensionally from one surface of the film to the other surface, characterized in that the porous ceramic film is formed on a substrate of glass, ceramic, or a heat-resistant metal, and relates to a method for manufacturing this film. The present invention provides a porous ceramic film having one-dimensional through channels with which there is little pressure loss. The porous ceramic film of the present invention can also be used as a ceramic filter if combined with a porous ceramic substrate. Also, if the amorphous film in the first stage of the film production is produced by sputtering or another such method, a ceramic film having nanometer-size through channels can be produced on a variety of different substrates, using glass, a ceramic, a heat-resistant metal, or the like as the substrate material. Also, when the amorphous film is produced by sputtering, the shape of the substrate surface can be other than flat, and it possible to form a uniform film on a substrate with a large surface area covering several square meters.

A ceramic filter that combines the porous ceramic film of the present invention with a porous ceramic substrate can be utilized not only as a simple gas separation membrane, but also in the removal of harmful gases contained in common factory exhaust gases, power plant exhaust gases, automotive exhaust gases, and so on, which is accomplished by varying the pore diameter as dictated by the application. Also, if titania or another such substance that acts as a photocatalyst is chosen as the filter material, for example, the product can be used as an active catalyst membrane. Furthermore, a highly efficient catalyst membrane can be obtained if the surface of the film is made to carry platinum particles or the like. Also, packing the pores of the film with a metal, an alloy, or another functional compound makes it possible to produce a film having electrically and magnetically new characteristics.

What is claimed is:

1. A ceramic film having one-dimensional through channels, which is composed of a porous ceramic film having nanometer-sized holes that pass through, one-dimensionally, the film from one surface of the film to the other surface of the film and are elongated perpendicularly to the film surface, wherein the porous ceramic film is formed on a substrate of glass, ceramic or a heat-resistant material, prepared by a process which comprises:

forming an amorphous film composed of at least a ternary system comprising a transition metal, another metal and oxygen on a substrate by a vapor phase growth method or a solution method;

heat treating the amorphous film under conditions which cause a eutectic decomposition reaction to occur, thereby forming a ceramic film composite composed of ceramic phases which have grown one-dimensionally therein and which are elongated perpendicularly from one film surface to the other surface of the film, and matrix phases which surround the ceramic phases; and removing the ceramic phases selectively by an etching procedure, thereby forming a plurality of one-dimensional channels which pass through the film attached to the substrate, which channels are elongated perpendicularly to the surfaces of the film.

2. A ceramic film having one-dimensional through channels as defined in claim 1, wherein the porous ceramic film is a metal oxide.

3. A ceramic film having one-dimensional through channels as defined in claim 1, wherein the substrate that supports the porous ceramic film is porous.

4. A ceramic film having one-dimensional through channels as defined in claim 1, wherein the average diameter of the one-dimensional through channels is 1 to 50 nanometers.

5. A ceramic film having one-dimensional through channels as defined in claim 1, wherein the process of preparing the ceramic film further comprises: peeling off the porous ceramic film from the supporting substrate.

6. A method for manufacturing a ceramic film having one-dimensional through channels of nanometer-sized holes which pass through, one-dimensionally, from one surface of the film to the other surface thereof and are elongated perpendicularly to the film surface, which comprises:

forming an amorphous film composed of at least a ternary system comprising a transition metal, another metal and oxygen on a substrate by a vapor phase growth method or a solution method;

heat treating the amorphous film under conditions which cause a eutectic decomposition reaction to occur, thereby forming a ceramic film composite composed of ceramic phases which have grown one-dimensionally therein and which are elongated perpendicularly from one film surface to the other surface of the film, and matrix phases which surround the ceramic phases; and removing the ceramic phases selectively by an etching procedure, thereby forming a plurality of one-dimensional channels which pass through the film attached to the substrate, which channels are elongated perpendicularly to the surfaces of the film.

* * * * *